US010249803B2

(12) United States Patent
Lin et al.

(10) Patent No.: US 10,249,803 B2
(45) Date of Patent: Apr. 2, 2019

(54) LIGHT-EMITTING DEVICE AND METHOD OF MANUFACTURING LIGHT-EMITTING DEVICE

(71) Applicant: Industrial Technology Research Institute, Hsinchu (TW)

(72) Inventors: Hsuan-Yu Lin, Changhua County (TW); Ting-Yu Wang, Kaohsiung (TW); Chih-Ming Lai, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 5 days.

(21) Appl. No.: 15/455,146

(22) Filed: Mar. 10, 2017

(65) Prior Publication Data

US 2018/0158999 A1    Jun. 7, 2018

(30) Foreign Application Priority Data

Dec. 7, 2016    (TW) .............................. 105140356 A

(51) Int. Cl.
| | |
|---|---|
| *H01L 33/38* | (2010.01) |
| *H01L 33/54* | (2010.01) |
| *H01L 33/62* | (2010.01) |

(52) U.S. Cl.
CPC .............. *H01L 33/54* (2013.01); *H01L 33/38* (2013.01); *H01L 33/62* (2013.01); *H01L 2933/0066* (2013.01)

(58) Field of Classification Search
None
See application file for complete search history.

(56) References Cited

U.S. PATENT DOCUMENTS

| | | |
|---|---|---|
| 8,053,977 B2 | 11/2011 | Lifka et al. |
| 9,105,871 B2 | 8/2015 | Hamm |
| (Continued) | | |

FOREIGN PATENT DOCUMENTS

| | | |
|---|---|---|
| CN | 1244699 | 2/2000 |
| CN | 104470024 | 3/2015 |
| (Continued) | | |

OTHER PUBLICATIONS

Hsin-Chu Chen et al., "Light-Emitting Assembly", Unpublished China application No. 201610278151.2, Filed on Apr. 29, 2016, pp. 1-46, which is corresponding to TWI568036 and U.S. Appl. No. 15/293,298.

(Continued)

*Primary Examiner* — Charles D Garber
*Assistant Examiner* — Xiaoming Liu
(74) *Attorney, Agent, or Firm* — JCIPRNET

(57) ABSTRACT

A light-emitting device and a method of manufacturing a light-emitting device are provided. The light-emitting device includes a transparent substrate having a first surface and a second surface opposite to the first surface, a light-emitting structure disposed on the first surface of the transparent substrate, a sealing layer, a carrier board, and a positive electrode and a negative electrode. The transparent substrate, the light-emitting structure, the sealing layer and the carrier board have corresponding through holes respectively, and at least one of the positive electrode and the negative electrode is disposed on the second surface of the transparent substrate.

19 Claims, 19 Drawing Sheets

(56) References Cited

U.S. PATENT DOCUMENTS

| | | | |
|---|---|---|---|
| 2006/0033430 A1 | 2/2006 | Peng | |
| 2010/0264430 A1* | 10/2010 | Takamura | H01L 51/5203 |
| | | | 257/88 |
| 2010/0294526 A1 | 11/2010 | Farquhar et al. | |
| 2012/0261692 A1* | 10/2012 | Yang | H01L 33/62 |
| | | | 257/98 |
| 2013/0155683 A1* | 6/2013 | Matsuda | F21V 15/01 |
| | | | 362/249.02 |
| 2013/0235592 A1* | 9/2013 | Takeuchi | F21V 23/001 |
| | | | 362/363 |
| 2016/0155945 A1 | 6/2016 | Lin et al. | |
| 2016/0293898 A1 | 10/2016 | Ciou et al. | |
| 2016/0293901 A1 | 10/2016 | Ciou et al. | |

FOREIGN PATENT DOCUMENTS

| | | |
|---|---|---|
| TW | 201242080 | 10/2012 |
| TW | 201419520 | 5/2014 |
| TW | I565120 | 1/2017 |
| TW | I568036 | 1/2017 |

OTHER PUBLICATIONS

Jyun-Kai Ciou et al., "Organic Electro-Luminescence Device and Fabricating Method Thereof", Unpublished China application No. 201610195135.7, Filed on Mar. 31, 2016, pp. 1-24, which is corresponding to US20160293901.

Hsin-Chu Chen et al., Light-Emitting Assembly, Unpublished U.S. Appl. No. 15/293,298, filed Oct. 14, 2016.

"Office Action of Taiwan Counterpart Application," dated Oct. 30, 2017, p. 1-p. 4.

\* cited by examiner

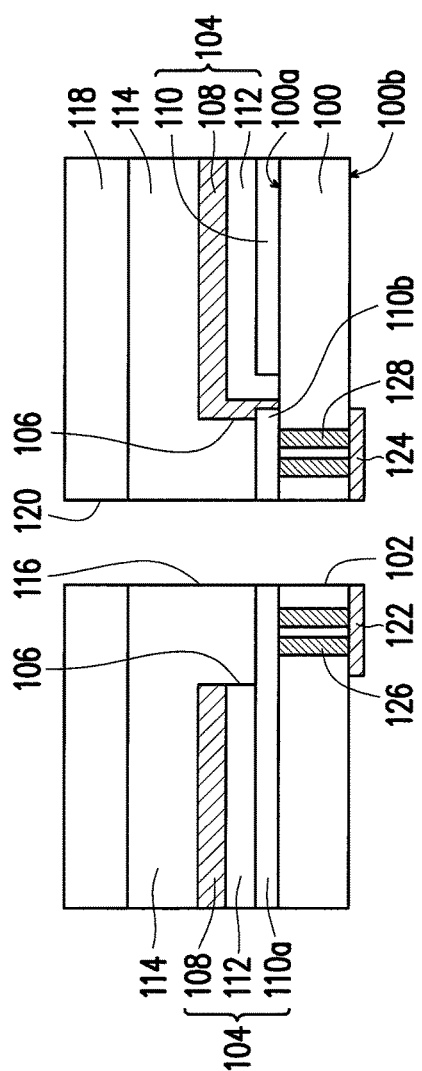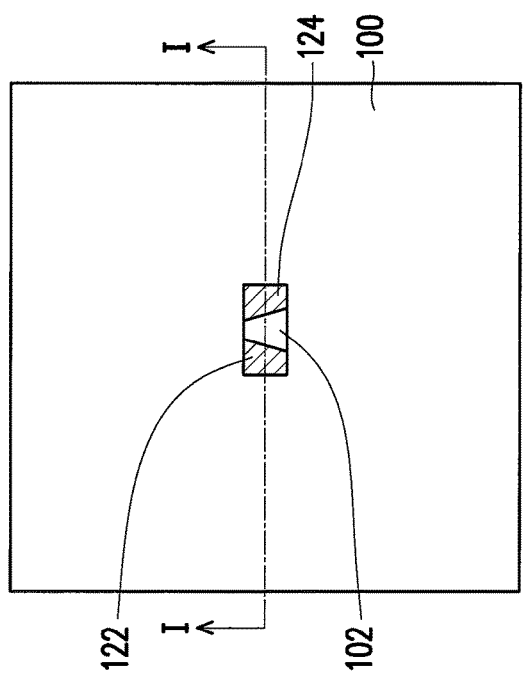
FIG. 1A
FIG. 1B

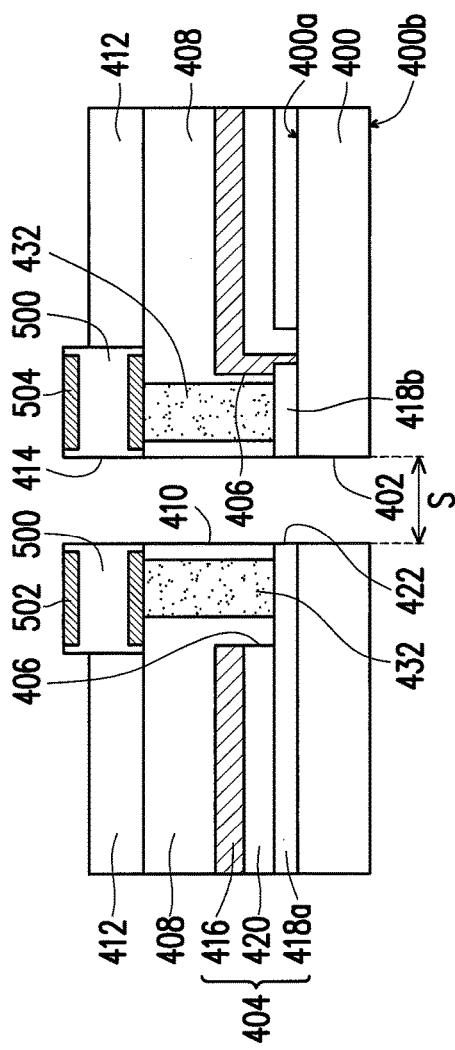
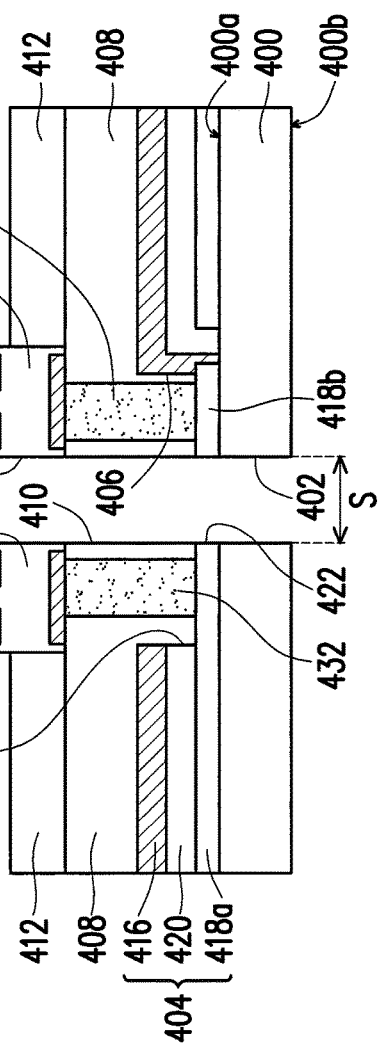
FIG. 5A
FIG. 5B

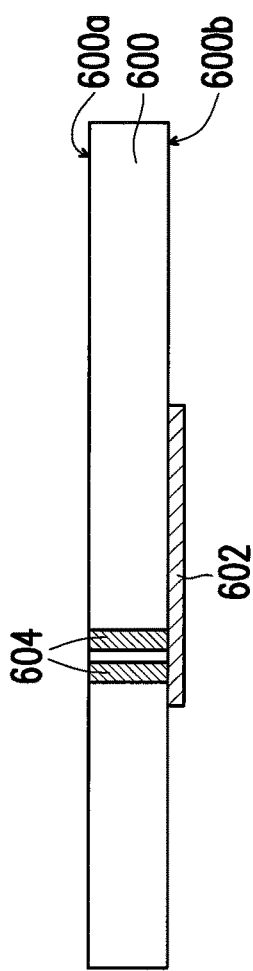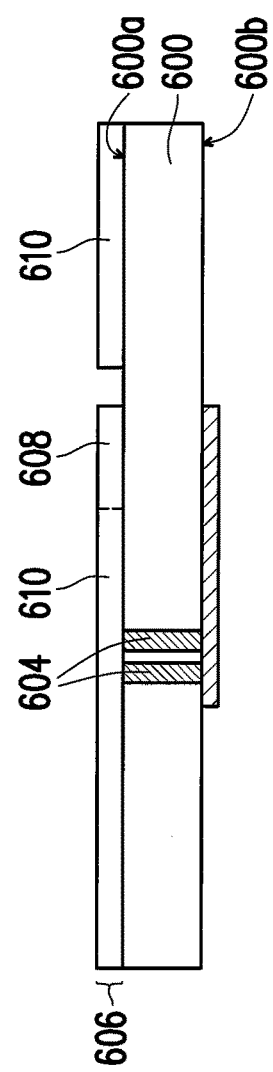
FIG. 6A
FIG. 6B

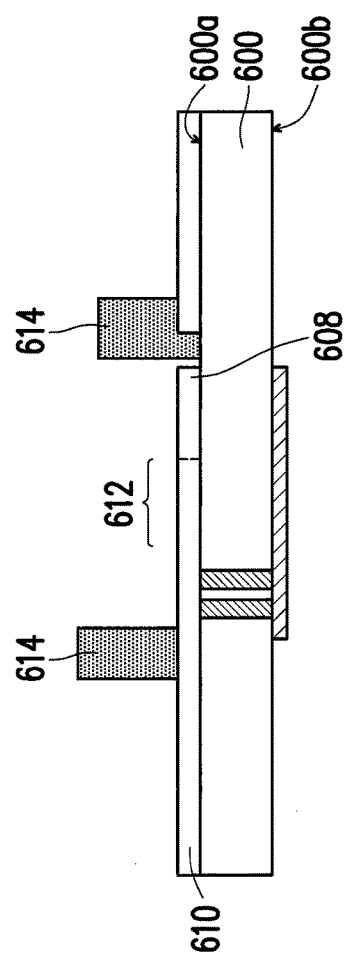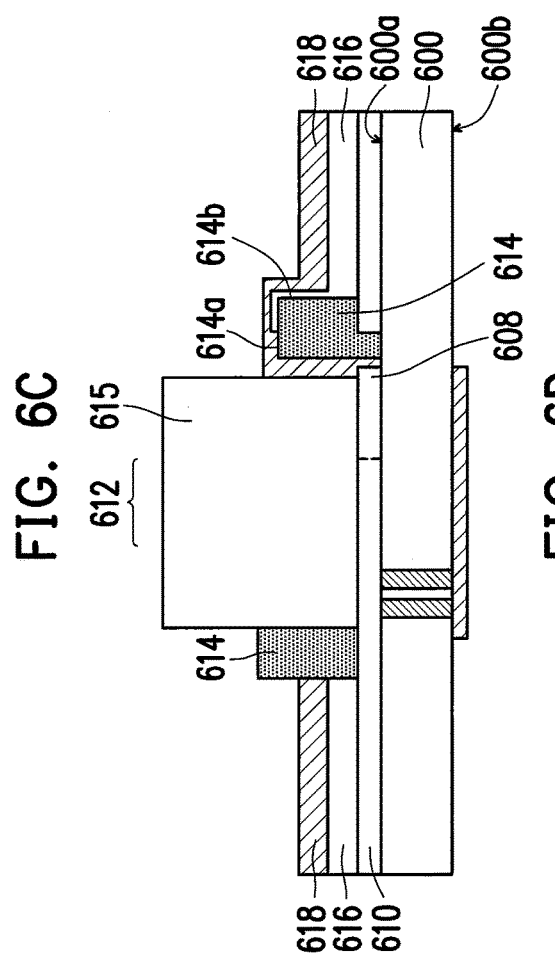

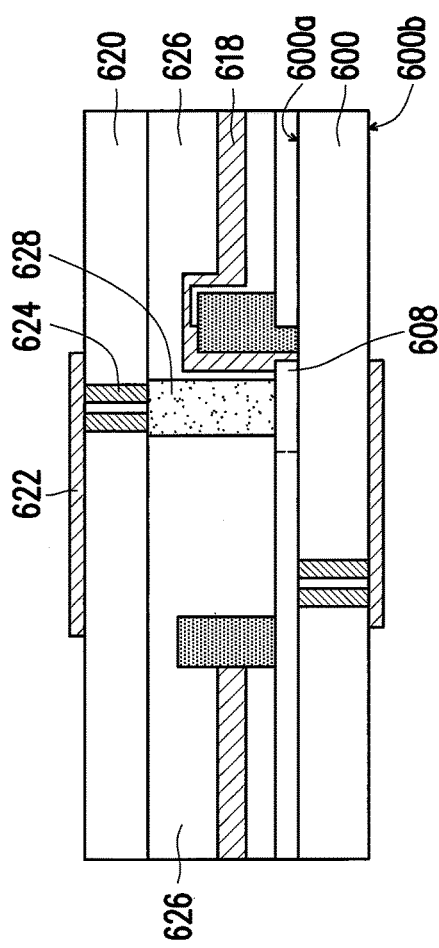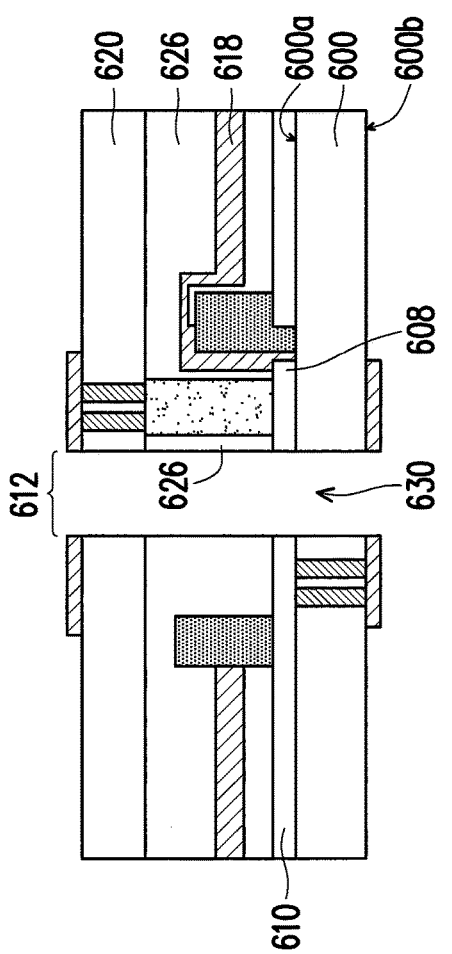

LIGHT-EMITTING DEVICE AND METHOD OF MANUFACTURING LIGHT-EMITTING DEVICE

CROSS-REFERENCE TO RELATED APPLICATION

This application claims the priority benefit of Taiwan application serial no. 105140356, filed on Dec. 7, 2016. The entirety of the above-mentioned patent application is hereby incorporated by reference herein and made a part of this specification.

TECHNICAL FIELD

The disclosure relates to a light-emitting device and a method of manufacturing a light-emitting device.

BACKGROUND

An organic light emitting diode (OLED) has some characteristics that cannot be realized by traditional light sources, such as high quantum efficiency, large area lighting, power saving, lightness, thinness and flexibility and so on. However, the light-emitting layer of an OLED device is easily degraded by penetration of moisture and oxygen, thus shortening the lifetime of the OLED device. Hence, the packaging of an OLED device is very important.

In view of current applications of OLED technology to lighting tools, since a proper barrier against moisture is needed for the light-emitting layer or the cathode layer, for assembling the OLED device to lamps or other lighting devices, it is usually necessary to pair the OLED device with additional refined equipments.

SUMMARY

In one embodiment of the disclosure, a light-emitting device includes a transparent substrate, a light-emitting structure, a sealing layer, a carrier board, and a positive electrode and a negative electrode. The transparent substrate has a first surface and a second surface opposite to the first surface, and has a first through hole penetrating the first surface and the second surface. The light-emitting structure is disposed on the first surface of the transparent substrate, and the light-emitting structure has at least a second through hole corresponding to the first through hole. Here the light-emitting structure includes a cathode layer, an anode layer, and a light-emitting layer disposed between the cathode layer and the anode layer. The sealing layer is disposed on the transparent substrate and covers the light-emitting structure, and the sealing layer has a third through hole corresponding to the first through hole. The carrier board is attached to the transparent substrate, and the sealing layer is disposed between the carrier board and the transparent substrate. Here the carrier board has a fourth through hole corresponding to the first through hole. The positive electrode and a negative electrode are electrically connected to the anode layer and the cathode layer respectively, and at least one of the positive electrode and the negative electrode is disposed on the second surface of the transparent substrate.

In another embodiment of the disclosure, a light-emitting device includes a transparent substrate, a light-emitting structure, a sealing layer, and a carrier board. The transparent substrate has a first surface and a second surface opposite to the first surface, and has a first through hole penetrating the first surface and the second surface. The light-emitting structure is disposed on the first surface of the transparent substrate, and the light-emitting structure has a second through hole corresponding to the first through hole. The sealing layer is disposed on the transparent substrate and covers the light-emitting structure, and the sealing layer has a third through hole corresponding to the first through hole. The carrier board is attached to the first surface of the transparent substrate, and the sealing layer is disposed between the carrier board and the transparent substrate. Here the carrier board has a fourth through hole corresponding to the first through hole, and hole diameters of the first through hole, the third through hole and the fourth through hole are the same.

In an embodiment of the disclosure, a manufacturing method of a light-emitting device includes the following steps. A transparent substrate that has a first surface and a second surface opposite to the first surface is provided. A positive electrode is disposed on the second surface of the transparent substrate, a first conductive component is disposed in the transparent substrate, and the first conductive component is connected to the positive electrode. A conductive layer is formed on the first surface of the transparent substrate, and it includes a conductive pad and an anode layer that is connected to the first conductive component. A patterned insulating layer is formed around a predetermined through hole position on the anode layer, and the conductive pad is exposed. A protective layer is formed inside the predetermined through hole position, and a portion of the conductive pad is exposed. A light-emitting layer and a cathode layer are formed sequentially on the first surface of the transparent substrate. The cathode layer extends to a top and a sidewall of the patterned insulating layer for connecting to the exposed conductive pad. The protective layer is then removed, and a carrier board is provided. A negative electrode is on a surface of the carrier board, and a second conductive component is in the carrier board. The second conductive component is connected to the negative electrode. The carrier board is laminated to the first surface of the transparent substrate by a sealing layer and a conductive colloid, so that the sealing layer is disposed between the carrier board and the transparent substrate, and the conductive colloid connects the second conductive component and the conductive pad. A through hole is formed in the carrier board, the sealing layer and the transparent substrate at the predetermined through hole position.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A is a schematic sectional view of a light-emitting device according to the first embodiment of the disclosure.

FIG. 1B is a schematic plan view of the light-emitting device of FIG. 1A.

FIG. 5A is a schematic sectional view of a light-emitting device according to the fifth embodiment of the disclosure.

FIG. 5B is a schematic sectional view of another light-emitting device according to the fifth embodiment of the disclosure.

FIGS. 6A to 6G are schematic sectional views illustrating a manufacturing process of a light-emitting device according to the sixth embodiment of the disclosure.

DETAILED DESCRIPTION OF DISCLOSED EMBODIMENTS

Figure 2A:
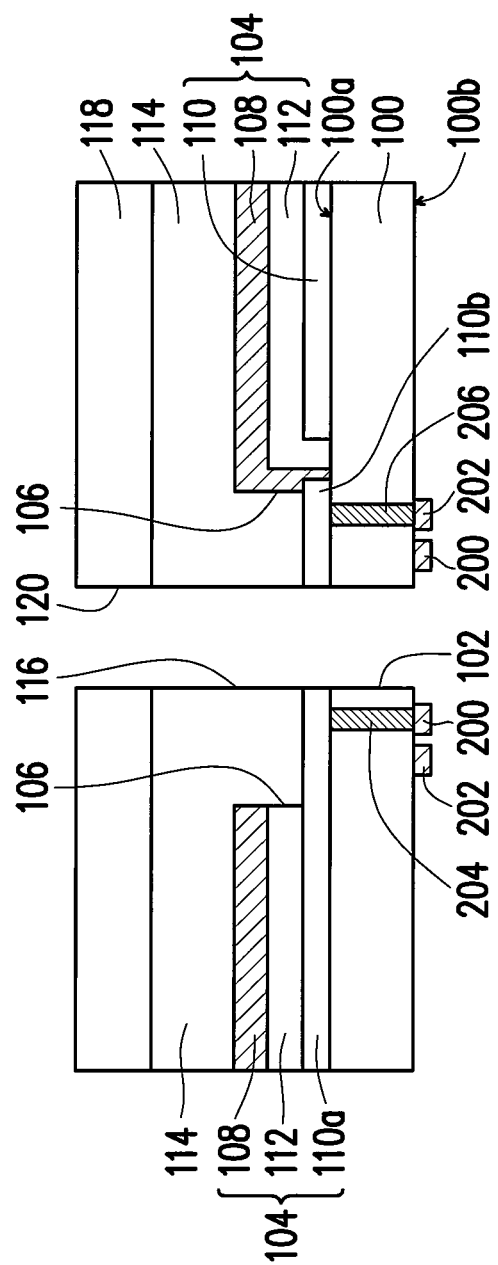
FIG. 2A is a schematic sectional view of a light-emitting device according to the second embodiment of the disclosure.

FIG. 1A is a schematic sectional view of a light-emitting device according to the first embodiment of the disclosure. FIG. 1B is a schematic plan view of the light-emitting device of FIG. 1A, and FIG. 1A shows a section along line I-I of FIG. 1B.

Please refer to FIG. 1A and FIG. 1B simultaneously. The light-emitting device of the first embodiment includes a transparent substrate 100, a light-emitting structure 104, a sealing layer 114, a carrier board 118, a positive electrode 122 and a negative electrode 124. The transparent substrate 100 has a first surface 100a, a second surface 100b and a first through hole 102. The second surface 100b is opposite to the first surface 100a, and the first through hole 102 penetrates the first surface 100a and the second surface 100b. The light-emitting structure 104 is disposed on the first surface 100a of the transparent substrate 100, and the light-emitting structure 104 includes a cathode layer 108, an anode layer 110a, and a light-emitting layer 112 disposed between the anode layer 110a and the cathode layer 108. The light-emitting structure 104 has at least a second through hole 106 corresponding to the first through hole 102, and the second through hole 106 is defined as sidewalls of the cathode layer 108 and the light-emitting layer 112 of the light-emitting structure 104. The sealing layer 114 is disposed on the transparent substrate 100 and covers the light-emitting structure 104, and has a third through hole 116 corresponding to the first through hole 102. The hole diameter of the second through hole 106 may be slightly larger than the hole diameter of the third through hole 116, so that the sealing layer 114 covers the sidewalls of the cathode layer 108 and the light-emitting layer 112 of the light-emitting structure 104 as shown in the drawing. The carrier board 118 is attached to the transparent substrate 100, and the sealing layer 114 is disposed between the carrier board 118 and the transparent substrate 100. The carrier board 118 also has a fourth through hole 120 corresponding to the first through hole 102. The carrier board 118 is, for example, a printed circuit board, a metal foil, a polymer thick film, or a combination thereof. The positive electrode 122 and the negative electrode 124 are electrically connected to the anode layer 110a and the cathode layer 108 respectively. Both of the positive electrode 122 and the negative electrode 124, as shown in FIG. 1A, are disposed on the second surface 100b of the transparent substrate 100, and the positive electrode 122 and the negative electrode 124 are respectively disposed on the second surface 100b at both sides of the first through hole 102. In addition, the shape of the through hole 102 may be designed to be asymmetric so as to prevent the electrodes from wrongly positioning the electrodes when installing.

FIG. 1A further shows a first conductive component 126 and a second conductive component 128 disposed in the transparent substrate 100. Here, the first conductive component 126 connects the positive electrode 122 and the anode layer 110a, and the second conductive component 128 connects the negative electrode 124 and the cathode layer 108. As shown in the drawing, the cathode layer 108 is electrically connected to the second conductive component 128 in an indirect way by a conductive pad 110b, which is located in the same layer as the anode layer 110a but is electrically isolated and disconnected from the anode layer 110a. But the embodiment is not limited thereto. For example, if the positions of the cathode layer 108 and/or the second conductive component 128 are changed so that the cathode layer 108 and the second conductive component 128 are contacted with each other, they may be electrically connected directly without any other structural layer in-between. The first conductive component 126 and the second conductive component 128 may be structured as metal wire or metal through holes.

FIG. 2A is a schematic sectional view of a light-emitting device according to the second embodiment of the disclosure. Here the same reference numerals as those of the first embodiment are used to indicate similar or identical components. Please refer to FIG. 2A. The light-emitting device of the second embodiment differs from that of the first embodiment in that a positive electrode 200 and a negative electrode 202 are respectively disposed on a second surface 100b of a transparent substrate 100 in a concentric manner around a first through hole 102. And a first conductive component 204 and a second conductive component 206 are disposed in the transparent substrate 100. The first conductive component 204 connects the positive electrode 200 and an anode layer 110a. The second conductive component 206 connects the negative electrode 202 and a cathode layer 108 via a conductive pad 110b.

Figure 2B:
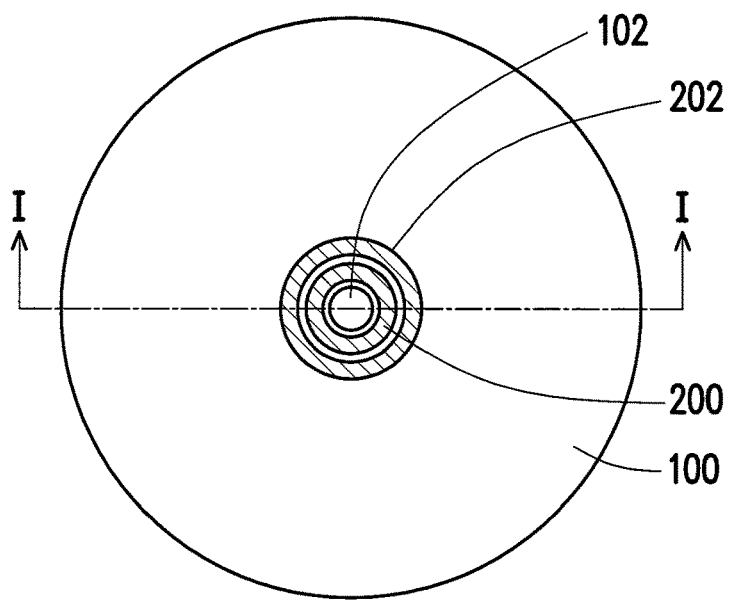
FIG. 2B is a schematic plan view of an example of the light-emitting device of FIG. 2A.
Figure 2C:
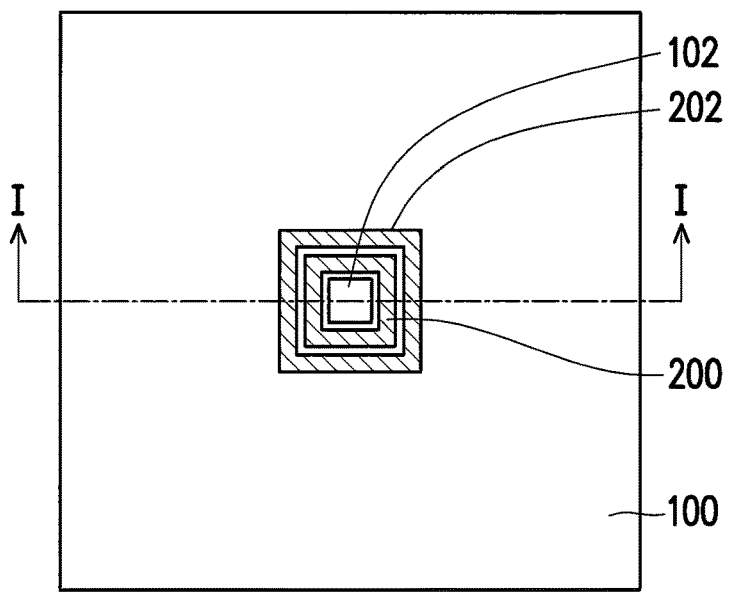
FIG. 2C is a schematic plan view of another example of the light-emitting device of FIG. 2A.

FIG. 2B and FIG. 2C are schematic plan views of two examples of the light-emitting device of FIG. 2A respectively. FIG. 2A shows a section along line I-I of FIG. 2B or FIG. 2C. In FIG. 2B, both of the transparent substrate 100 and the first through hole 102 are circular in shape, so the positive electrode 200 and the negative electrode 202 are distributed as an inner circle and an outer circle. In FIG. 2C, both of the transparent substrate 100 and the first through hole 102 are square in shape, so the positive electrode 200 and the negative electrode 202 are distributed as an inner square and an outer square.

Figure 3:
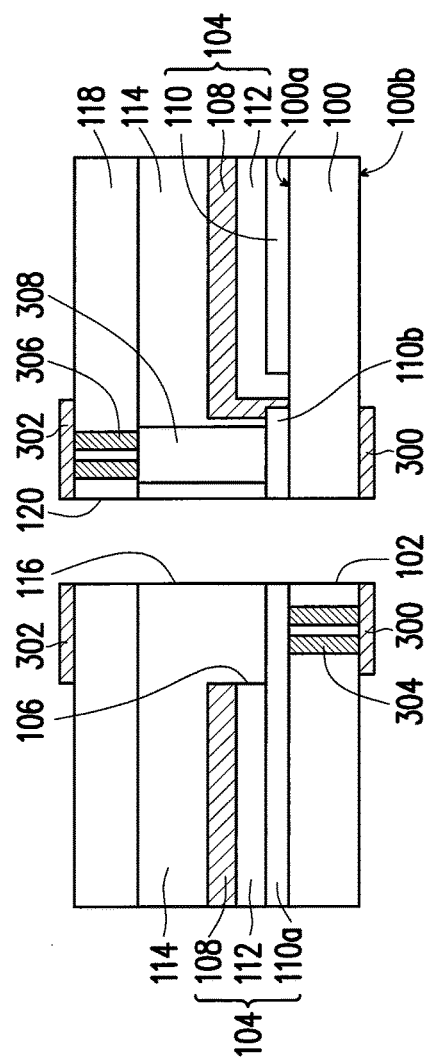
FIG. 3 is a schematic sectional view of a light-emitting device according to the third embodiment of the disclosure.

FIG. 3 is a schematic sectional view of a light-emitting device according to the third embodiment of the disclosure. Here the same reference numerals as those of the first embodiment are used to represent similar or identical components. Please refer to FIG. 3. The light-emitting device of the third embodiment differs from that of the first embodiment in that a positive electrode 300 is disposed on a second surface 100b of a transparent substrate 100 but a negative electrode 302 is disposed on a carrier board 118. Therefore, the design of the light-emitting device needs a third conductive component 304 disposed in the transparent substrate 100, a fourth conductive component 306 disposed in the carrier board 118, and a conductive colloid 308 disposed in a sealing layer 114. Here, the third conductive component 304 connects the positive electrode 300 and an anode layer 110a. The fourth conductive component 306 connects the negative electrode 302 and a cathode layer 108 via the conductive colloid 308 and a conductive pad 110b.

Figure 4:
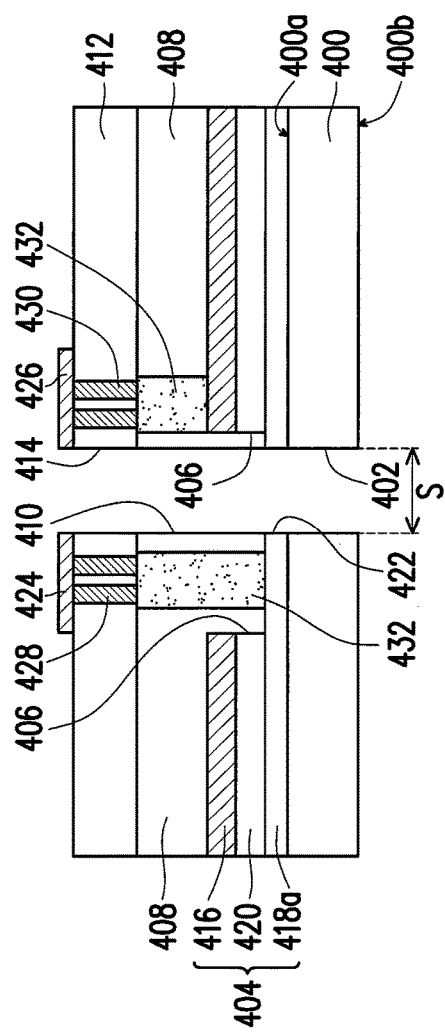
FIG. 4 is a schematic sectional view of a light-emitting device according to the fourth embodiment of the disclosure.

FIG. 4 is a schematic sectional view of a light-emitting device according to the fourth embodiment of the disclosure. Please refer to FIG. 4. The light-emitting device of the fourth embodiment includes a transparent substrate 400 having a first through hole 402, a light-emitting structure 404 having a second through hole 406, a sealing layer 408 having a third through hole 410, and a carrier board 412 having a fourth through hole 414. The transparent substrate 400 also has a first surface 400a and a second surface 400b opposite to the first surface 400a. The first through hole 402 penetrates the first surface 400a and the second surface 400b. The second through hole 406, the third through hole 410 and the fourth through hole 414 all correspond to the first through hole 402, and the first through hole 402, the third through hole 410 and the fourth through hole 414 have the same hole diameter S. The light-emitting structure 404 is disposed on the first surface 400a of the transparent substrate 400. The sealing layer 408 is disposed on the transparent substrate 400 and covers the light-emitting structure 404, the carrier board 412 is attached to the transparent substrate 400, and the sealing layer 408 is disposed between the carrier board 412 and the transparent substrate 400.

In FIG. 4, the light-emitting structure 404 includes a cathode layer 416, an anode layer 418a, and a light-emitting layer 420 disposed between the anode layer 418a and the cathode layer 416. The cathode layer 416 and the light-emitting layer 420 have the second through hole 406, and the anode layer 418a has a fifth through hole 422 with the same hole diameter S as the first through hole 402. Here the hole diameter of the second through hole 406 is larger than the hole diameter of the third through hole 410, so that the sealing layer 408 covers sidewalls of the cathode layer 416 and the light-emitting layer 420 of the light-emitting structure 404 to achieve the effect of blocking moisture. In addition, the light-emitting device of this embodiment further has a positive electrode 424 and a negative electrode 426 that are electrically connected to the anode layer 418a and the cathode layer 416 respectively. The positive electrode 424 and the negative electrode 426 are respectively disposed on a surface of the carrier board 412 at both sides of the fourth through hole 414. Therefore, the shape of the fourth through hole 414, just as the first through hole 102 in FIG. 1B, is asymmetric so as to prevent the electrodes from wrongly positioning when installing. Besides, the positive electrode 424 is electrically connected to the anode layer 418a indirectly by a first conductive component 428 disposed in the carrier board 412 and by a conductive colloid 432 disposed in the sealing layer 408. The negative electrode 426 is electrically connected to the cathode layer 416 indirectly by a second conductive component 430 disposed in the carrier board 412 and by the conductive colloid 432 disposed in the sealing layer 408.

Besides, the positive electrode 424 and the negative electrode 426 in the fourth embodiment may also be respectively disposed on the carrier board 412 in a concentric manner around the fourth through hole 414 instead. Please refer to FIGS. 2B and 2C for detailed structure, and repeated description of the same contents is omitted here. Besides, the designs of the positive and negative electrodes in the first to third embodiments may also be applied to the fourth embodiment. For example, at least one of the positive electrode 424 and the negative electrode 426 in the fourth embodiment may be disposed on the second surface 400b of the transparent substrate 400 instead, or both of the positive electrode 424 and the negative electrode 426 may be disposed on the second surface 400b of the transparent substrate 400 instead. Please refer to the above embodiments for related contents.

FIG. 5A and FIG. 5B are schematic sectional views of two light-emitting devices according to the fifth embodiment of the disclosure. Here the same reference numerals as those of the fourth embodiment are used to indicate similar or identical components.

Please refer to FIG. 5A first. The light-emitting device of the fifth embodiment differs from that of the fourth embodiment in that a positive electrode 502 and a negative electrode 504 are electric circuits inside a printed circuit board 500 and are accompanied by a carrier board 412 such as a metal foil. Here the negative electrode 504 is connected to a cathode layer 416 by a conductive colloid 432 and a conductive pad 418b. The conductive pad 418b and an anode layer 418a are conductive layers that are located in the same layer but are electrically isolated and disconnected from each other. In FIG. 5B, a positive electrode 508 and a negative electrode 510 are also electric circuits inside a printed circuit board 506, but here the positive electrode 508 and the negative electrode 510 respectively surrounds a fourth through hole 414 in a concentric manner. Accordingly, in this disclosure, a printed circuit board, a metal foil, a polymer thick film or a combination thereof may serve as a whole or a part of the carrier board 412 depending on different design needs.

FIGS. 6A to 6G are schematic sectional views illustrating a manufacturing process of a light-emitting device according to the sixth embodiment of the disclosure.

Please refer to FIG. 6A first. A transparent substrate 600 is provided. The transparent substrate 600 has a first surface 600a and a second surface 600b opposite to the first surface 600a. A positive electrode 602 is disposed on the second surface 600b of the transparent substrate 600, and a first conductive component 604 is disposed in the transparent substrate 600, wherein the first conductive component 604 is connected to the positive electrode 602. The transparent substrate 600 is, for example, a polymer thick film (PTF).

Please refer to FIG. 6B. A conductive layer 606 is formed on the first surface 600a of the transparent substrate 600, and the conductive layer 606 includes a conductive pad 608 and an anode layer 610 that is connected to the first conductive component 604.

Please refer to FIG. 6C. A patterned insulating layer 614 is formed around a predetermined through hole position 612 on the anode layer 610, and the conductive pad 608 is exposed. Although the present drawing is a sectional view, it should be known that the patterned insulating layer 614 is a continuous layer around the predetermined through hole position 612. In one embodiment, a portion of the patterned insulating layer 614 is formed between the anode layer 610 and the conductive pad 608.

Please refer to FIG. 6D. A protective layer 615 is formed inside the predetermined through hole position 612, and a portion of the conductive pad 608 is exposed. The protective layer 615 is, for example, a multilayer film that includes at least one release film or a monolayer film composed of a release film. A light-emitting layer 616 and a cathode layer 618 are formed sequentially on the first surface 600a of the transparent substrate 600. Here the cathode layer 618 extends to a top 614a and a sidewall 614b of the patterned insulating layer 614 and is connected to the exposed conductive pad 608. In addition, a portion of the light-emitting layer 616 may extend to the top 614a and the sidewall 614b of the patterned insulating layer 614. However, because the light-emitting layer 616 is usually much thinner than the patterned insulating layer 614 in thickness, the light-emitting layer 616 generally does not extend beyond the patterned insulating layer 614.

Figure 6E:
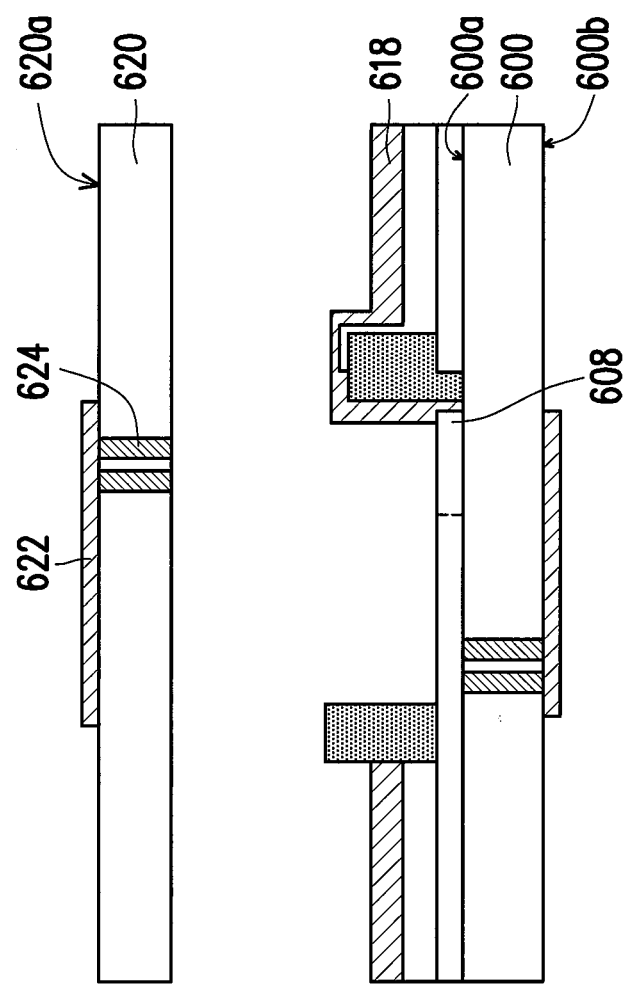

Please refer to FIG. 6E. The protective layer 615 is removed, and a carrier board 620 is provided. The carrier board 620 has a negative electrode 622 on a surface 620a and a second conductive component 624 in the carrier board 620. Here the second conductive component 624 is connected to the negative electrode 622. The carrier board 620 is, for example, a polymer thick film.

Please refer to FIG. 6F. The carrier board 620 is laminated to the first surface 600a of the transparent substrate 600 by a sealing layer 626 and a conductive colloid 628, so that the sealing layer 626 is disposed between the carrier board 620 and the transparent substrate 600. And the conductive colloid 628 connects the second conductive component 624 and the conductive pad 608 so that the negative electrode 622 is electrically connected to the conductive pad 608 in an indirect way.

Then please refer to FIG. 6G. A perforation step may be performed, so that a through hole 630 is formed in the carrier board 620, the sealing layer 626 and the transparent substrate 600 at the predetermined through hole position 612. Accordingly, the hole diameter of the through hole 630 is identical throughout, and the through hole 630 also makes the conductive pad 608 and the anode layer 610 become separate and disconnected from each other.

FIGS. 7A to 7F are schematic sectional views illustrating a manufacturing process of a light-emitting device according to the seventh embodiment of the disclosure.

Figure 7A:
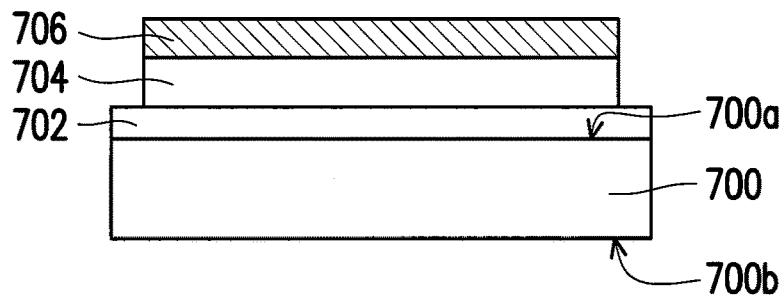
FIGS. 7A to 7F are schematic sectional views illustrating a manufacturing process of a light-emitting device according to the seventh embodiment of the disclosure.

Please refer to FIG. 7A first. A transparent substrate 700 is provided. The transparent substrate 700 has a first surface 700a and a second surface 700b opposite to the first surface 700a. An anode layer 702, a light-emitting layer 704 and a cathode layer 706 are formed sequentially on the first surface 700a of the transparent substrate 700.

Figure 7B:
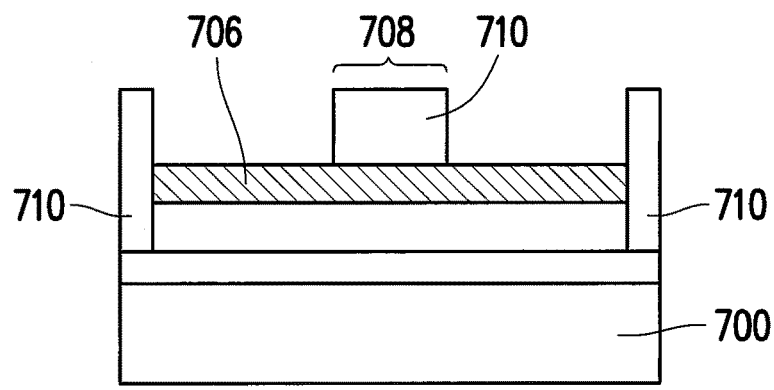

Please refer to FIG. 7B. A patterned insulating layer 710 is formed on the cathode layer 706 at a predetermined through hole position 708. The patterned insulating layer 710 may be further formed on the transparent substrate 700 except for the cathode layer 706.

Figure 7C:
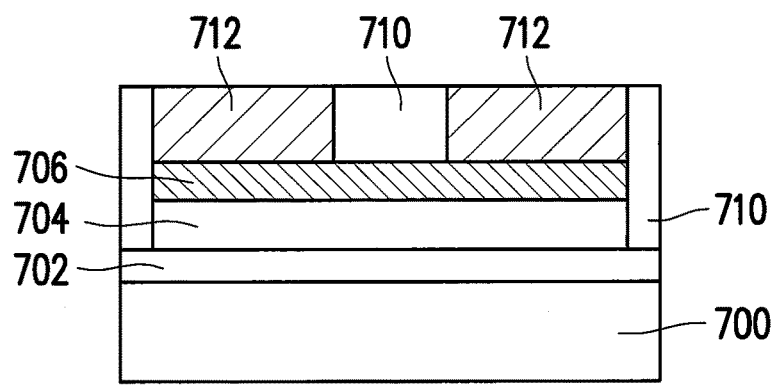

Please refer to FIG. 7C. A metal layer 712 is formed on the cathode layer 706 for completely filling the space within the patterned insulating layer 710, and it is used as an etching mask during the subsequent etching process. But the disclosure is not limited thereto. There are other methods to manufacture the metal layer 712 and will be described in detail later.

Figure 7D:
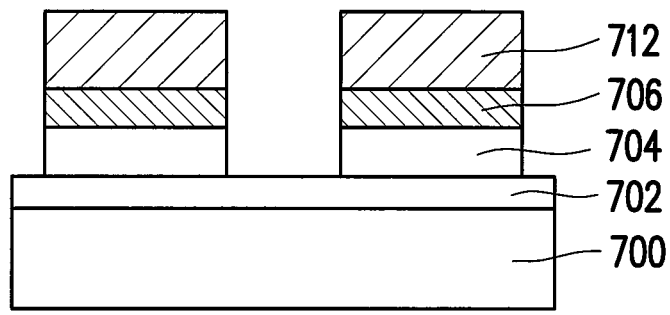

Please refer to FIG. 7D. First, the patterned insulating layer 710 is removed. Then, the uncovered areas of the cathode layer 706 and the light-emitting layer 704 are etched by using the metal layer 712 as the etching mask.

Figure 7E:
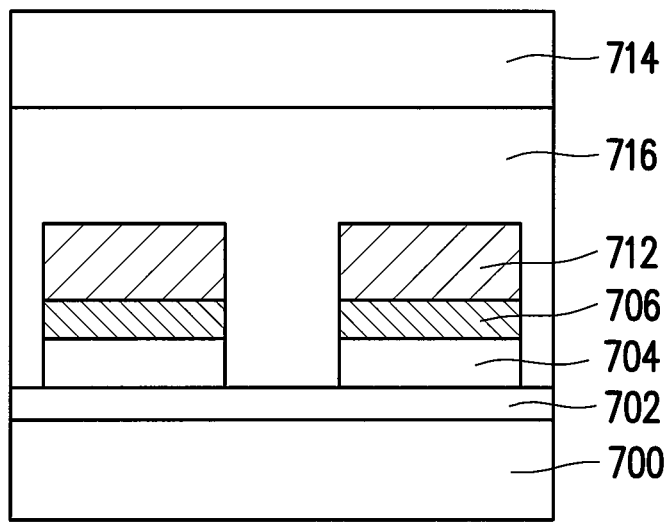

Please refer to FIG. 7E. A carrier board 714 is provided, and the carrier board 714 is laminated to the transparent substrate 700 by a sealing layer 716, so that the sealing layer 716 is disposed between the carrier board 714 and the transparent substrate 700.

Figure 7F:
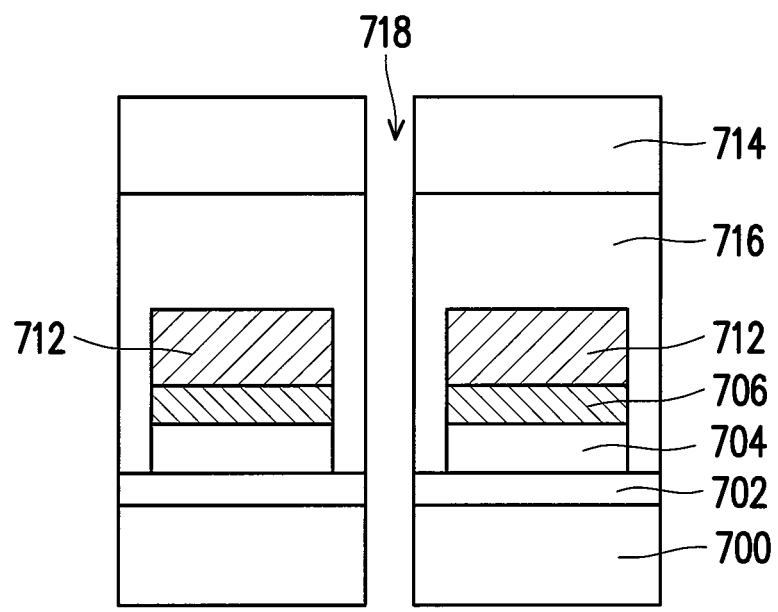

Then please refer to FIG. 7F. A perforation step may be performed, so that a through hole 718 is formed on the carrier board 714, the sealing layer 716 and the transparent substrate 700 at a predetermined through hole position. Accordingly, the through hole 718 has the same hole diameter in the carrier board 714, the sealing layer 716, and the transparent substrate 700. The carrier board 714, depending on different design needs, may be a printed circuit board, a metal foil, a polymer thick film or a combination thereof.

Figure 8:
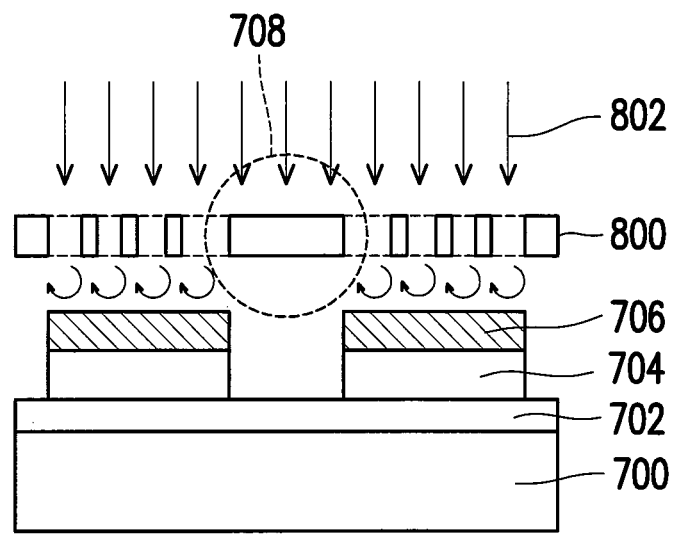
FIG. 8 is a schematic sectional view of an alternative example of FIG. 7C of the seventh embodiment.

FIG. 8 is a schematic sectional view of an alternative example of FIG. 7C of the seventh embodiment. Please refer to FIG. 8. The metal layer (712) in the seventh embodiment may also be achieved by evaporation with a shadow mask 800, wherein the shadow mask 800 is disposed over the cathode layer 706 and has mesh holes. Here, evaporated deposits 802 are made to pass through the mesh holes of the shadow mask 800 so as to generate vortices underneath and to further form a metal layer (not shown) on the cathode layer 706.

Figure 9:
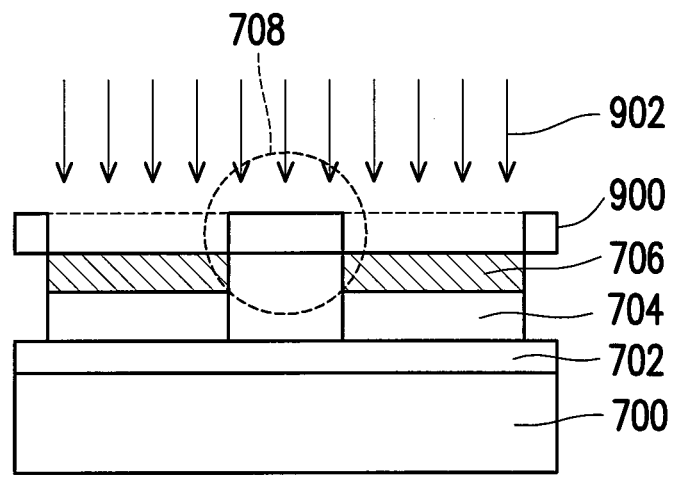
FIG. 9 is a schematic sectional view of another alternative example of FIG. 7C of the seventh embodiment.

FIG. 9 is a schematic sectional view of another alternative example of FIG. 7C of the seventh embodiment. Please refer to FIG. 9. The metal layer (712) in the seventh embodiment may also be achieved using an evaporation method accompanied by a magnetic shadow mask 900. Here, evaporated deposits 902 are made to pass through the magnetic shadow mask 900 so as to form a metal layer on the cathode layer 706 (not shown).

If the light-emitting devices of the above embodiments are applied to lighting tools, the following assembly designs are to be obtained.

Figure 10A:
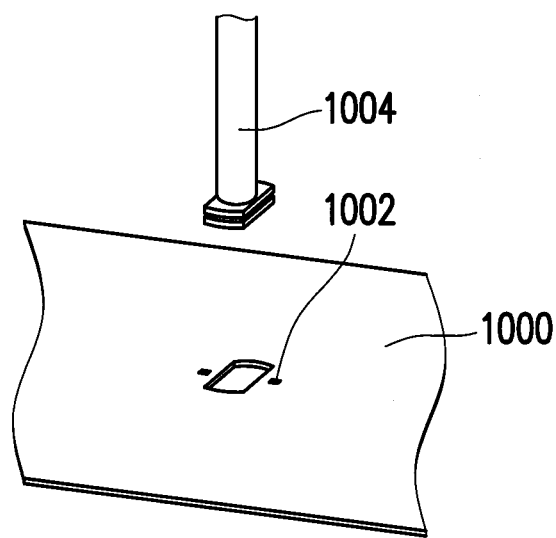
FIG. 10A is an exploded perspective view of a lighting tool according to the eighth embodiment of the disclosure.
Figure 10B:
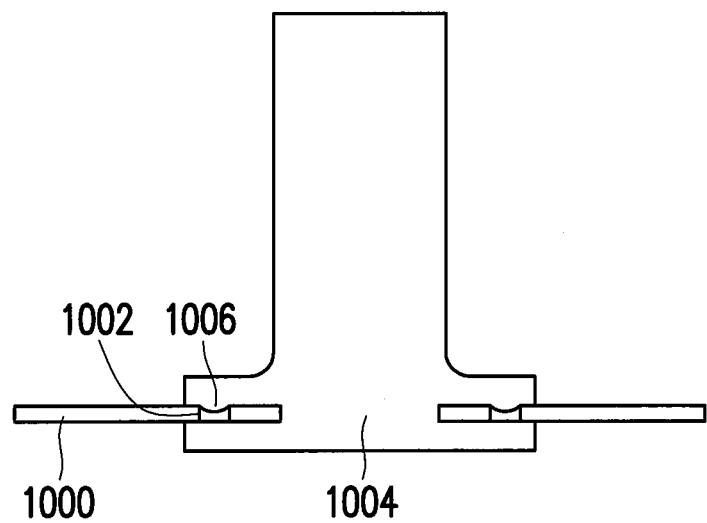
FIG. 10B is a schematic sectional view of the lighting tool of FIG. 10A after assembly.

FIG. 10A is an exploded perspective view of a lighting tool according to the eighth embodiment of the disclosure. FIG. 10B is a schematic sectional view of the lighting tool of FIG. 10A after assembly.

In FIG. 10A, a light-emitting device 1000 has a large through hole and small through holes 1002 that are disposed at two sides of the large through hole, and is accompanied by a fastener 1004. The assembly method is to insert the fastener 1004 through the large through hole and rotate the fastener 1004 by 90 degrees, so that a convex portion 1006 thereof gets stuck in the small through holes 1002 and is fixed into position, as shown in FIG. 10B.

Figure 11:
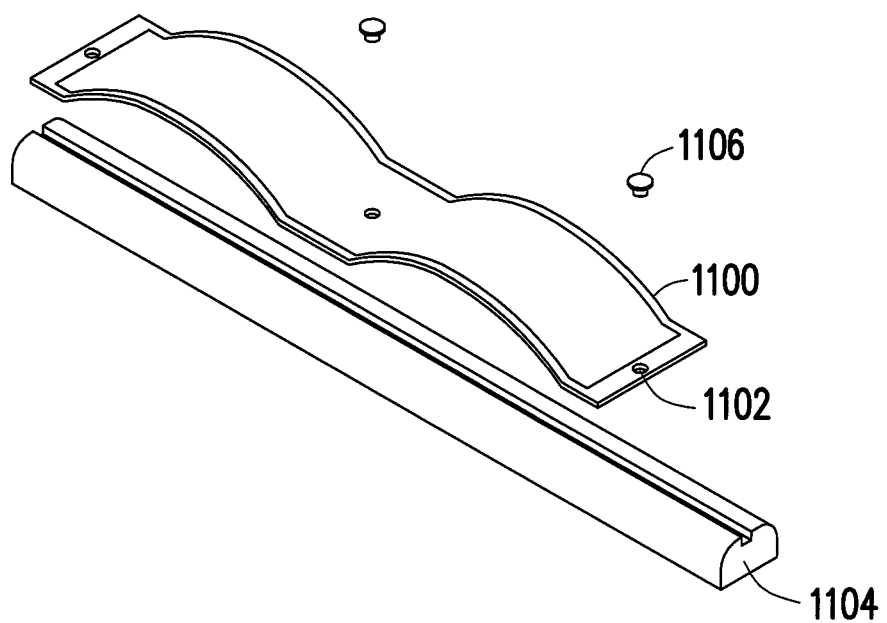
FIG. 11 is an exploded perspective view of a lighting tool according to the ninth embodiment of the disclosure.

FIG. 11 is an exploded perspective view of a lighting tool according to the ninth embodiment of the disclosure. In FIG.

11, a light-emitting device 1100 has through holes 1102 and is accompanied by a lamp holder 1104 and fasteners 1106. Thus, the light-emitting device 1100 is fixed on the lamp holder 1104 by inserting the fastener 1106 through the through hole 1102, and curvature of the light-emitting device 1100 is alterable by moving the position of the fastener 1106 on the lamp holder 1104. The fastener 1106 is, for example, a metal (alloy) pop-rivet, a plastic pop-rivet or a rivet.

Figure 12A:
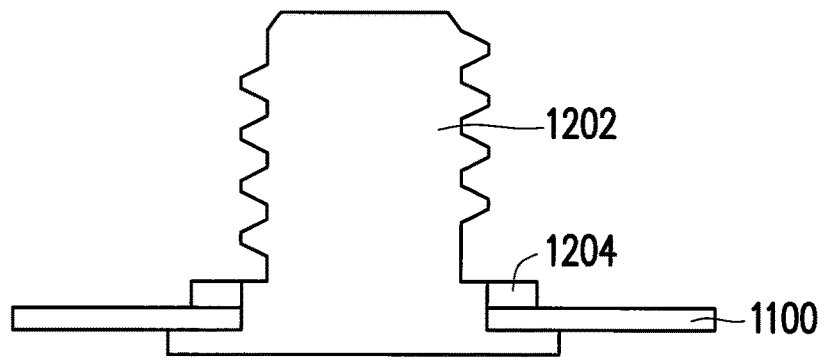
FIG. 12A is a schematic sectional view of one kind of fastener in the ninth embodiment.
Figure 12B:
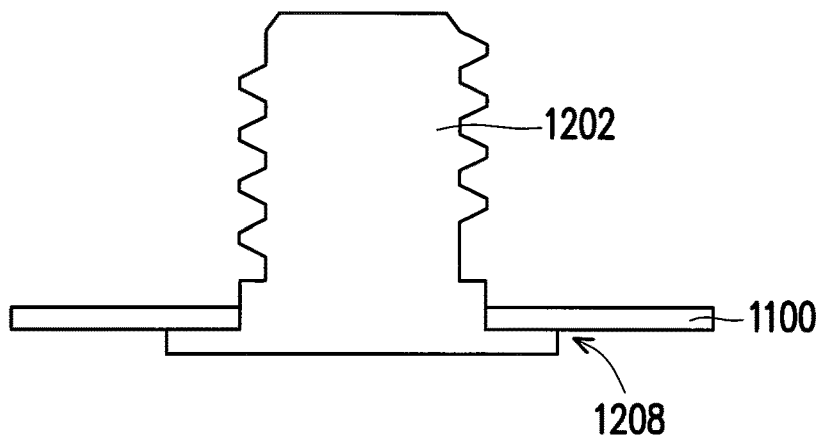
FIG. 12B is a schematic sectional view of another kind of fastener in the ninth embodiment.
Figure 12C:
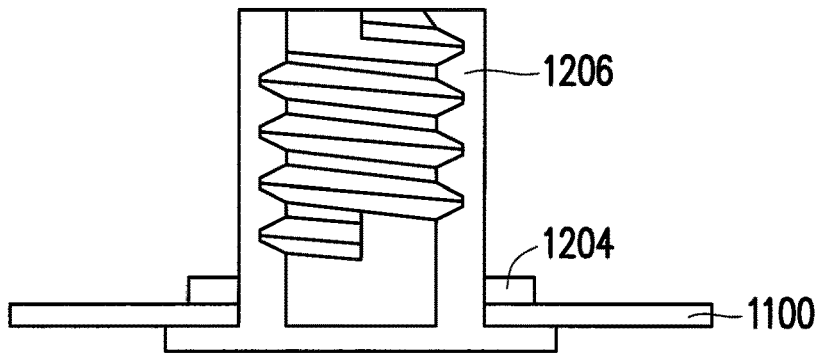
FIG. 12C is a schematic sectional view of yet another kind of fastener in the ninth embodiment.

FIG. 12A, FIG. 12B, and FIG. 12C are schematic sectional views of three kinds of fastener in the ninth embodiment. In both FIG. 12A and FIG. 12B, the light-emitting device 1100 is assembled by inserting a male thread screw 1202 through a through hole. However, in FIG. 12A there is an additional tablet 1204 for riveting, while in FIG. 12B the male thread screw 1202 is directly adhered to the light-emitting device 1100 in an adhesion portion 1208. In FIG. 12C, assembly is performed by using the tablet 1204 and a female thread screw 1206.

Figure 13:
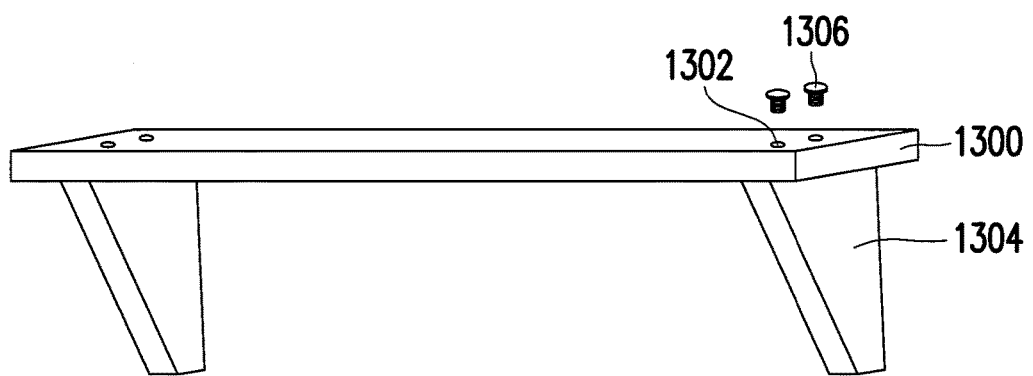
FIG. 13 is a schematic perspective view of a lighting tool according to the tenth embodiment of the disclosure.

FIG. 13 is a schematic perspective view of a lighting tool according to the tenth embodiment of the disclosure. In FIG. 13, a light-emitting device 1300 is designed as a display shelf and is accompanied by fixing devices 1304 and fixing components 1306. Each of the fixing components 1306 is inserted through a through hole 1302 to be assembled to the fixing device 1304.

Figure 14A:
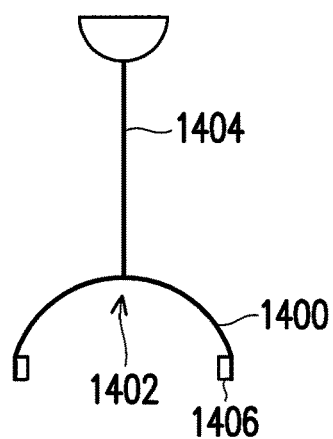
FIG. 14A is a schematic perspective view of one kind of lighting tool according to the eleventh embodiment of the disclosure.
Figure 14B:
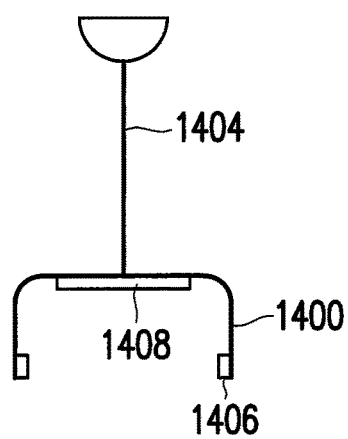
FIG. 14B is a schematic perspective view of another kind of lighting tool according to the eleventh embodiment of the disclosure
Figure 14C:
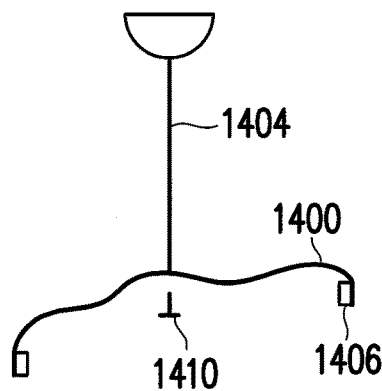
FIG. 14C is a schematic perspective view of yet another kind of lighting tool according to the eleventh embodiment of the disclosure.

FIG. 14A, FIG. 14B, and FIG. 14C are schematic perspective views of three kinds of lighting tool according to the eleventh embodiment of the disclosure. In FIGS. 14A to 14C, a light-emitting device 1400 is connected to a light fixture 1404 via a through hole 1402, and it is accompanied by a hook portion 1406 or a fixing component 1408 and a fastener 1410 to achieve variations of natural curvature (as shown in FIG. 14A), special curvature (as shown in FIG. 14B), or twisting curvature (as shown in FIG. 14C).

Figure 15:
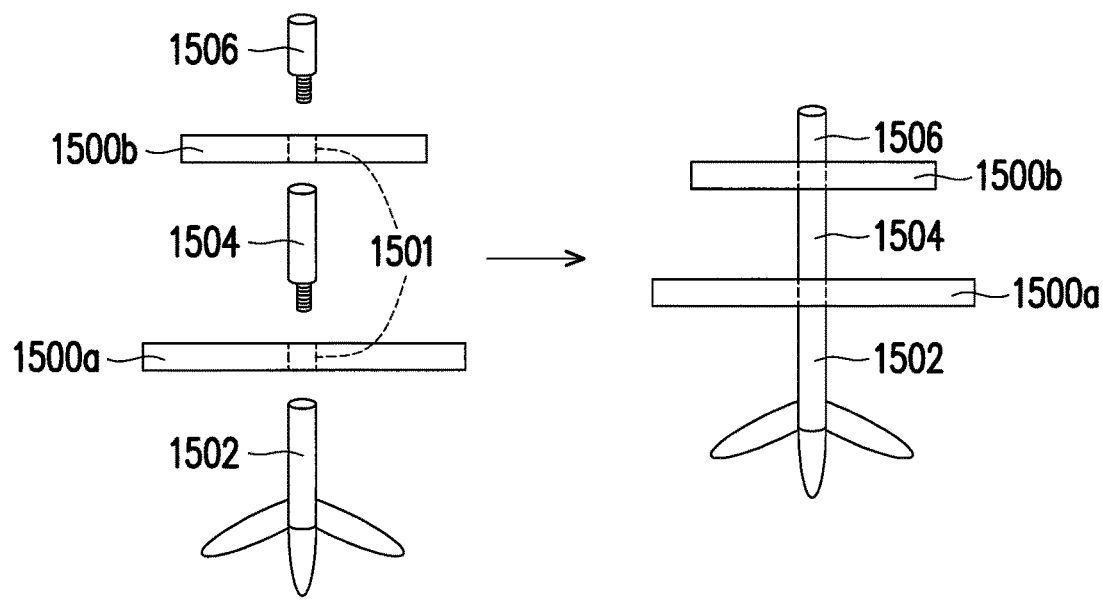
FIG. 15 is a schematic view illustrating the assembly process of a lighting tool according to the twelfth embodiment of the disclosure.

FIG. 15 is a schematic view illustrating the assembly process of a lighting tool according to the twelfth embodiment of the disclosure. In FIG. 15, light-emitting devices 1500a and 1500b are connected to a fixing device 1502 by inserting threaded rods 1504 and 1506 through a through hole 1501.

Figure 16:
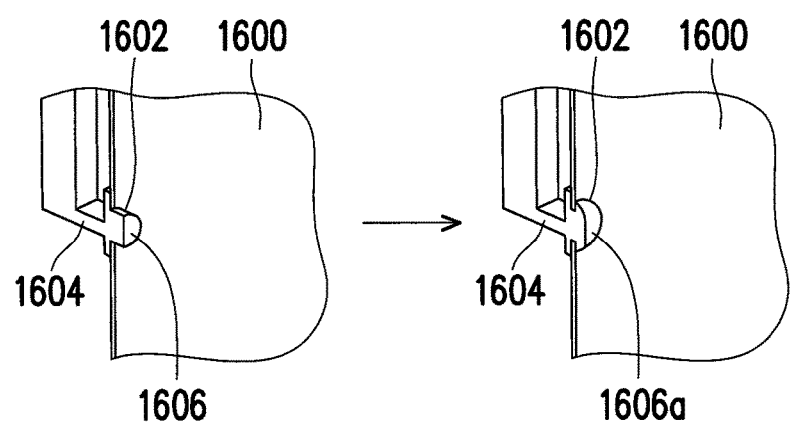
FIG. 16 is a schematic view illustrating the assembly process of a lighting tool according to the thirteenth embodiment of the disclosure.

FIG. 16 is a schematic view illustrating the assembly process of a lighting tool according to the thirteenth embodiment of the disclosure. In FIG. 16, assembly between a light-emitting device 1600 and a light fixture 1604 is performed by inserting a convex portion 1606 into a through hole 1602 and then melting the convex portion 1606, so that a hot melt portion 1606a is formed to fix the light-emitting device 1600 on the light fixture 1604 without using additional joining components.

In summary of the above, in this disclosure, by the design of components, the light-emitting device has an identical through hole throughout so that it is able to be easily installed to and removed from a light fixture, and is applicable to a variety of lighting equipments without the use of complicated components as in the past. In addition, the light-emitting device having a through hole may be accompanied by a lamp holder and a fastener so that a user may fix the light-emitting device to the lamp holder easily, and may easily alter the curvature of the light-emitting device by changing the position of the moveable fastener on the lamp holder so that the light fixture exhibits different styling changes and lighting effects.

Although the embodiments are already disclosed as above, these embodiments should not be construed as limitations on the scope of this disclosure. It will be apparent to those ordinarily skilled in the art that various modifications and variations can be made to the disclosed embodiments without departing from the spirit or scope of the disclosure. In view of the foregoing, it is intended that the disclosure covers modifications and variations provided that they fall within the scope of the following claims and their equivalents.

What is claimed is:

1. A light-emitting device comprising:
   a transparent substrate having a first surface and a second surface opposite to the first surface and having a first through hole penetrating the first surface and the second surface;
   a light-emitting structure disposed on the first surface of the transparent substrate, and the light-emitting structure having at least a second through hole corresponding to the first through hole, wherein the light-emitting structure comprises a cathode layer, an anode layer, and a light-emitting layer disposed between the cathode layer and the anode layer;
   a sealing layer disposed on the transparent substrate and covering the light-emitting structure, and the sealing layer having a third through hole corresponding to the first through hole;
   a carrier board attached to the transparent substrate, and the sealing layer disposed between the carrier board and the transparent substrate, wherein the carrier board has a fourth through hole corresponding to the first through hole, wherein the inner wall of the first, third and fourth through holes is continuous having a same cross section view from the top; and
   a positive electrode and a negative electrode electrically connected to the anode layer and the cathode layer respectively, and at least one of the positive electrode and the negative electrode disposed on the second surface of the transparent substrate.

2. The light-emitting device according to claim 1, wherein both of the positive electrode and the negative electrode are disposed on the second surface of the transparent substrate.

3. The light-emitting device according to claim 2, wherein the positive electrode and the negative electrode are respectively disposed on the second surface in a concentric manner around the first through hole.

4. The light-emitting device according to claim 2, wherein the positive electrode and the negative electrode are respectively disposed on the second surface at both sides of the first through hole.

5. The light-emitting device according to claim 4, wherein the shape of the first through hole is asymmetric.

6. The light-emitting device according to claim 2 further comprising:
   a first conductive component disposed in the transparent substrate to connect the positive electrode and the anode layer; and
   a second conductive component disposed in the transparent substrate to connect the negative electrode and the cathode layer.

7. The light-emitting device according to claim 1 further comprising:
   a third conductive component disposed in the transparent substrate to connect the positive electrode and the anode layer;
   a fourth conductive component disposed in the carrier board to connect the negative electrode and the cathode layer; and
   at least one conductive colloid disposed in the sealing layer to connect the cathode layer and the fourth conductive component.

8. The light-emitting device according to claim 1, wherein the hole diameter of the second through hole is larger than the hole diameter of the third through hole, so that the sealing layer covers sidewalls of the cathode layer and the light-emitting layer of the light-emitting structure.

9. The light-emitting device according to claim 1, wherein the carrier board comprises a printed circuit board, a metal foil, a polymer thick film, or a combination thereof.

10. A light-emitting device comprising:
   a transparent substrate having a first surface and a second surface opposite to the first surface and having a first through hole penetrating the first surface and the second surface;
   a light-emitting structure disposed on the first surface of the transparent substrate, and the light-emitting structure having a second through hole corresponding to the first through hole;
   a sealing layer disposed on the transparent substrate and covering the light-emitting structure, and the sealing layer having a third through hole corresponding to the first through hole; and
   a carrier board attached to the first surface of the transparent substrate and the sealing layer disposed between the carrier board and the transparent substrate, wherein the carrier board has a fourth through hole corresponding to the first through hole, and hole diameters of the first through hole, the third through hole and the fourth through hole are the same, wherein the inner wall of the first, third and fourth through holes is continuous having a same cross section view from the top.

11. The light-emitting device according to claim 10, wherein the light-emitting structure comprises a cathode layer, an anode layer, and a light-emitting layer disposed between the cathode layer and the anode layer, and the cathode layer and the light-emitting layer have the second through hole, and the anode layer has a fifth through hole with the same hole diameter as the first through hole.

12. The light-emitting device according to claim 11, wherein the hole diameter of the second through hole is larger than the hole diameter of the third through hole, so that the sealing layer covers sidewalls of the cathode layer and the light-emitting layer of the light-emitting structure.

13. The light-emitting device according to claim 11 further comprising: a positive electrode and a negative electrode electrically connected to the anode layer and the cathode layer respectively.

14. The light-emitting device according to claim 13, wherein at least one of the positive electrode and the negative electrode is disposed on the second surface of the transparent substrate.

15. The light-emitting device according to claim 13, wherein the positive electrode and the negative electrode are both disposed on a surface of the carrier board.

16. The light-emitting device according to claim 15, wherein the positive electrode and the negative electrode are respectively disposed on the carrier board in a concentric manner around the fourth through hole.

17. The light-emitting device according to claim 15, wherein the positive electrode and the negative electrode are respectively disposed on the carrier board at both sides of the fourth through hole.

18. The light-emitting device according to claim 17, wherein the shape of the fourth through hole is asymmetric.

19. The light-emitting device according to claim 15 further comprising:
   a first conductive component disposed in the carrier board to connect the positive electrode;
   a second conductive component disposed in the carrier board to connect the negative electrode; and
   a plurality of conductive colloids disposed in the sealing layer to connect the positive electrode and the first conductive component and connect the cathode layer and the second conductive component respectively.

* * * * *